Figure 1:
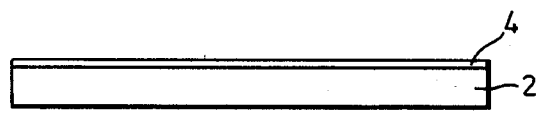
Figure 2:
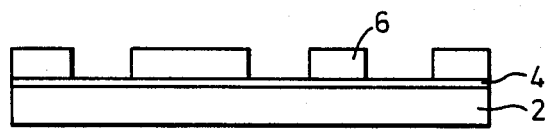

United States Patent [19]

Moran

[11] Patent Number: 4,915,759

[45] Date of Patent: Apr. 10, 1990

[54] METHOD FOR PRODUCING A MULTILAYER SYSTEM

[76] Inventor: Peter L. Moran, 21 Windermere Drive, Alderley Edge, England

[21] Appl. No.: 8,498

[22] Filed: Jan. 29, 1987

[30] Foreign Application Priority Data

Jan. 30, 1986 [GB] United Kingdom ............... 8602331

[51] Int. Cl.$^4$ .............................................. B32B 31/24
[52] U.S. Cl. ...................................... 156/89; 427/96; 427/99; 427/118; 427/124; 427/126.2
[58] Field of Search ............... 156/89; 427/96, 98, 427/99, 117, 118, 124, 125, 126.2

[56] References Cited

U.S. PATENT DOCUMENTS

| | | | |
|---|---|---|---|
| 4,010,291 | 3/1977 | Katsube et al. | 427/126.2 |
| 4,345,955 | 8/1982 | Bakermans et al. | 156/89 |
| 4,503,090 | 3/1985 | Brown | 427/126.2 |
| 4,574,095 | 3/1986 | Baum et al. | 427/124 |
| 4,657,778 | 4/1987 | Moran | 427/99 |
| 4,701,351 | 10/1987 | Jackson | 427/98 |

*Primary Examiner*—Caleb Weston
*Attorney, Agent, or Firm*—Cushman, Darby & Cushman

[57] ABSTRACT

A method of producing a multilayer system comprising the steps of:

1. adhering a continuous cohesive pattern of electrically conductive oxidisable material (e.g. copper) to an electrically insulating surface of a substrate,
2. coating the pattern and the parts of the substrate surface not adhering to the pattern with a firable dielectric which is fusable at 500°–600° C.,
3. firing the dielectric to 500°–600° C. to cause fusion of the dielectric, whereby an oxide-fused dielectric bond is formed. Also multilayers having the features of the products of this method.

10 Claims, 1 Drawing Sheet

METHOD FOR PRODUCING A MULTILAYER SYSTEM

The present invention relates to multilayer systems and to methods of producing lower layer conductors and electrical insulators in such multilayer systems.

Multilayer systems take the form of a substrate which supports a plurality of layers of electrical conductors separated from one another by layers of insulation but selectively interconnected to one another by means of through connections in the layers of insulation.

In a previously proposed system each layer of conductors is formed on a substrate and covered with a dielectric layer which then forms the substrate for the next conductive layer. Through holes are formed in the dielectric layer to enable interconnections between adjacent conductive layers. Such through holes may be formed at the time of screen printing if the conductors are also screen printed or instead be formed later for example by laser drilling.

The conductive layer is formed by screen printing a thick film (as the technique is commonly known) of particulate conductive material on the substrate. The conductive film is then heated to promote sintering and adhesion of the layer to the substrate. Thereafter the whole is coated with a glass-forming dielectric and then fired in a furnace at a temperature in the range of from 600° C. to 900° C. to melt the dielectric and to promote adhesion of the dielectric to the substrate. The conductive material may be of copper or copper based materials. The screen printing process is, however, generally limited in resolution. Copper and copper based materials, because they are deposited as small particles and not as a solid layer, they are subject to oxidation throughout the layer and therefore require processing in an inert environment for example of nitrogen to inhibit oxidation. In this case dielectric glass forming materials must also be processed in a nitrogen environment and these are generally difficult to fabricate.

Furnaces providing a nitrogen environment are complex and, especially if run at 600° to 900° C., expensive to run. Not all dielectrics are suitable for firing in a nitrogen environment (including those that can be fired at lower temperatures), and those that are tend to become somewhat porous. Even if the insulator is built up layer by layer the desired density is not achieved and the insulator remains porous.

It is an object of the invention to provide a multilayer system and an improved method of making the system, at a lower temperature than hitherto.

According to the invention there is provided a method of producing a multilayer system comprising the steps of:

a. adhering a pattern of electrically conductive oxidisable material to an electrically insulating surface of a substrate, b. oxidising part of the pattern, c. coating the pattern and the parts of the substrate surface not adhering to the pattern with a firable dielectric, and d. firing the dielectric to a temperature sufficient to cause fusion of the dielectric, whereby a bond is formed between the fused dielectric and the oxidised part of the pattern, characterised in that the pattern is solid and bonded to the substrate in step (a), the dielectric is fusable at 500° to 600° C., the dielectric is fired to 500° to 600° C., and only the outer layer of the pattern (that not adhering to the substrate) is oxidised.

Steps (b) and (c) may be carried out in either order. In a preferred embodiment steps (b) and (c) are carried out in reverse order. The dielectric is then an air-firing dielectric, and in steps (b) and (d) is fired in air to a temperature sufficient to cause oxygen diffusing through the coating dielectric to oxidise the outer layer of the pattern, and therafter cause fusion and adhesion of the dielectric as described. Fusion also inhibits further diffusion of oxygen to the pattern.

By the term 'solid' describing the pattern herein we mean that the oxidisable material within each part of the pattern is continuous, impervious to gas and cohesive, as contrasted for example with the particulate or sintered pattern layers of the prior art.

By the term 'bonded' we include solid patterns directly bonded to the substrate or indirectly bonded thereto, for example by being bonded to or integral with a so-called seed layer, which in turn may be directly or indirectly bonded to the substrate.

The use of a solid pattern means that the degree of deleterious internal oxidation of the pattern is minimised and the need for sintering to promote its cohesion and adhesion (with the concomitant need for stringent process conditions to minimise oxidation) is avoided. The use of a dielectric fusing at substantially lower temperatures than those hitherto saves energy, renders the oxidation of the pattern and any other integer more controllable and widens the choice of materials for the other integers by lowering their requisite softening or melting points. Further, surface oxidation and dielectric fusion may be carried out effectively in a single step in air, since precautions to limit oxidation are unnecessary. The range of dielectrics which can be readily used is significantly increased over that which could be used in a nitrogen environment. Advantageously, the dielectrics fired in air are generally more dense primarily due to the increased amount of free oxygen available during the firing step.

The temperature sufficient to fuse the dielectric, and that sufficient to oxidise the outer layer of the pattern when coated with the dielectric lies in the range 500° to 600° C. It will be appreciated that it is generally not wished that any other component of the multilayer system (in particular the substrate) fuses at or below the firing temperature(s), and the materials of all the components and the firing temperatures will be chosen accordingly.

According to the invention there is also provided a method of producing a multilayer system comprising the steps of:

a. oxidising part of a pattern of an electrically conductive oxidisable material b. burying the pattern in a firable dielectric and c. firing the dielectric to intimately bond the fired dielectric to the oxidised part of the pattern, characterised in that the pattern is solid, the dielectric is fusable at 500° to 600° C., the dielectric is fired to 500° to 600° C., and only the surface of the pattern is oxidised.

Steps (a) and (b) may be carried out in either order.

In a preferred embodiment steps (a) and (b) are carried out in reverse order. The dielectric is then an air-firing dielectric, and in steps (a) and (c) is fired in air to oxidise the surface of the pattern to provide a means by which the fired dielectric becomes intimately bonded to the pattern, and to form a glass layer which inhibits further diffusion of oxygen from the dielectric to a greater depth within the pattern.

Suitable process parameters are as so described hereinbefore.

According to the invention there is still further provided a method of producing a multilayer system characterised by:

a. coating an electrically insulating susbstrate with a seed layer of an electrically conductive oxidisable material which on oxidation is non-conductive and glass-forming, b. depositing a pattern of solid conductor on the seed layer, c. oxidising the parts of the seed layer not in contact with the pattern to their full depth, d. coating the whole with a firable dielectric which is fusable at 500° to 600° C., and e. firing the system to 500° to 600° C. to fuse the dielectric.

Steps (c) and (d) may be carried out in either order.

In a preferred embodiment steps (c) and (d) are carried out in reverse order. The dielectric is then an air-firing dielectric and in steps (c) and (e) is fired in air to effect oxidation of the seed layer to the extent set out in step (c). The firing temperature must of course be sufficient to effect steps (c) and (e).

Suitable process parameters are as so described hereinbefore.

According to the invention there is yet further provided a multilayer structure comprising a substrate having at least one surface composed of an electrically insulating material, a solid pattern of an oxidisable electrically conductive material bonded to said surface and having an oxidised outer layer (that not adhering to the substrate), and a coating of fired dielectric both on said pattern and that part of said surface not bonded to said pattern.

In the present system, suitable dielectric insulators include any glass insultors which fuse within the temperature range 500° to 600° C. given hereinbefore.

The conductive material in the present system is selected for its ability to fulfil the parameters of the processes of the invention and for compatibility with dielectric insulators, substrates and/or seed layers within the present system. Thus, for example, the material must be capable of forming a solid pattern as defined hereinbefore, and/or of being applied as such to a substrate or seed layer.

In preferred embodiments (see below) this is effected by plating, so that the material must then be a platable metal. It is often convenient that the material is the same metal as the seed layer if present. Again to be useful practically, e.g. for small or microcircuits, the material must allow very high definition conductive patterns to be formed.

The conductive material must be oxidisable within the controllable bounds of the processes. In preferred embodiments this must occur with only oxygen diffusing through a fusing or fused dielectric coat.

The conductive material and/or its oxidised surface must be compatible with dielectric insulators, substrates and for seed layers. In preferred embodiments the dielectric insulator is an air-firing dielectric, in particular a glass-forming insulator, and the material and/or its oxidised surface must then be compatible with such.

For the foregoing reasons suitable conductive materials include chromium, copper, silver and palladium and alloys thereof.

Chromium, copper and alloys thereof are also suitable materials (inter alia) for any seed layer which may be present. Other suitable materials include gold and rhodium, and mixtures thereof and alloys thereof. In the embodiment where the seed layer not covered by the pattern is oxidised, any electrically conductive material can be used which has the dual properties of, upon oxidation, becoming both non-conductive and of ceramic or glassy form to provide a strong adhesive bond with ceramic, glass or glass-ceramic substrates and dielectric covering layers.

It is often convenient to deposit the seed layer onto another metal 'adhesive' by plating, in particular electroless plating.

Figure 7:
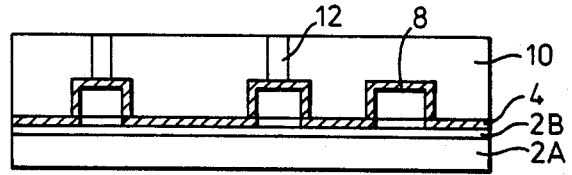

A multilayer system and method of producing the system will now be described, by way of example, with reference to the accompanying diagrammatic drawings in which:

FIGS. 1 to 6 are sections through the system at different stages of production; and FIG. 7 is a section through a modified system.

The multilayer system and improved method of making the system to be described below are particularly concerned with the production of conductive layer and dielectric insulator lower in a multilayer (at least two layers) system (e.g. nearer to the substrate).

The specific description is also particularly concerned with that embodiment of the system which comprises a seed layer, parts of which are oxidised through their total depth. It is also particularly concerned with that preferred embodiment of the process where coating with a dielectric insulator precedes air-firing oxidation of the solid. However, it will be obvious without further description that embodiments of the process where either of these features is absent may be readily derived from the following description by omitting the relevant parts of the process.

As shown in FIG. 1 a seed layer 4 is introduced and bonded onto the surface of a substrate 2.

The substrate 2 may suitably be a ceramic, a glass, or a glass-ceramic material which softens at a temperature substantially higher than that of the air-firing dielectric insulator subsequently applied.

When the substrate 2 is a ceramic it is preferably one selected from the group consisting of berylia, alumina, aluminium nitride and silicon carbide.

Suitable glasses and glass-ceramics include respectively high-melting borosilicate and barium glasses and high-melting glass containing dissolved metal oxides.

The substrate 2 may also suitably be a coating of one or more such materials on a metal sheet for example to a thickness in the range 0.25 to 0.75 um. Suitable sheet metals include iron, cobalt, nickel and copper and alloys thereof, including stainless steels and low carbon steels.

The seed layer 4 may conveniently be copper.

The seed layer 4, when copper, may conveniently be introduced and bonded onto the substrate by known electroless plating, e.g. by adsorbing a reductive system such as hydrogen/palladium ion/palladium metal onto a micro-etched substrate surface, and reducing copper ion from solution onto the surface to effect an electroless deposition of the copper seed layer to a depth of 0.2 to 4 um, for example about 2 um, in particular 0.5 um–1 um.

While the seed layer 4 is described as being formed by electroless deposition it will be appreciated that it can equally be formed by a thin film or a metallorganic method, as are known in the art.

Referring again to FIG. 1, a solid pattern 8 (as defined hereinbefore) of a suitably oxidisable metal (as mentioned hereinbefore), preferably copper, is then formed on the seed layer 4.

The solid pattern 8 may conveniently be formed in situ, for example by selective masking and plating of the seed layer 4.

Alternatively the seed layer 4 may be omitted and the pattern 8 formed directly on the substrate 2 by other methods. These other methods may also be used for formation of the pattern 8 on a seed layer 4.

In one such method the conductive pattern 8 is formed by sputtering or evaporation of the conductor through a mask. In such embodiments it is preferred to first sputter on a coterminous adhesive pattern such as one of chromium, titanium or tantalum. Alternatively, the substrate is uniformly coated by plating, sputtering or evaporation and the conductive material selectively removed by wet etching or by sputter or plasma etching to leave the required pattern.

In another method the conductive pattern is formed on the substrate by an electroless plating method guided by a resist using a catalyst such as palladium. Instead an auto catalysing electroless plating process can be used.

In yet another method a sheet of conductive material is directly bonded to the substrate at high temperature to form a chemical bond. An electrically conductive pattern would then be produced by selective removal of the material with the aid of a resist.

The ex situ formation of a solid pattern 8 and its application to the substrate 2 or seed layer 4 are not excluded.

In the present embodiment the copper seed layer 4 is coated with light-hardening electrical resist 6 to a thickness in the range of from 12 to 50 um, preferably 25 um. The resist 6 is exposed to a light pattern corresponding to a desired conductor pattern. The unhardened parts of the resist 6 are then selectively dissolved with a conventional fluid (see FIG. 2) to selectively expose the copper layer 4 underneath, defined by a resist corresponding to a negative of the desired pattern.

The exposed copper layer 4 is then electroplated with solid copper to a thickness and width at all points well in excess of the thickness of the seed layer, for example 3 to 15 um, in particular about 7 um and the residual resist is removed in any manner known in the art. The result as shown in FIG. 3 is that a thick solid conductor pattern 8 is built up on a thin conductive layer.

Figure 3:
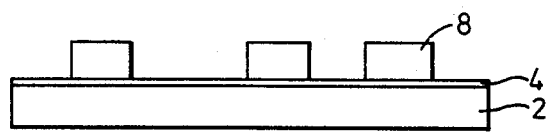

In FIG. 3, a thick film of air-firing dielectric (for example 35 to 55 um, in particular about 45 um thick) 10 is then deposited to cover the copper layers 4 and 8.

The dielectric 10 is preferably deposited by a screen printing process. The dielectric preferably takes the form of particles of a glass having a fusion temperature in the range 500°–600° C. suspended in ethyl cellulose dissolved in butyl carbitol. After screen printing the dielectric 10 is dried to evaporate the butyl carbitol. The ethyl cellulose then acts as a binder for the glass particles.

The entire assembly is then fired in air at a temperature between 500°–600° C. so that the ethyl cellulose burns off and the glass melts or fuses to form a dense substantially non-porous glass-based electrical insulator layer.

Figure 4:
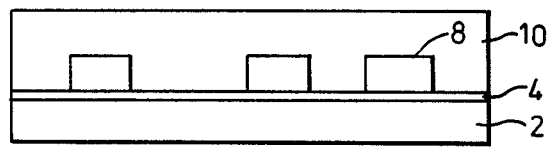
Figure 5:
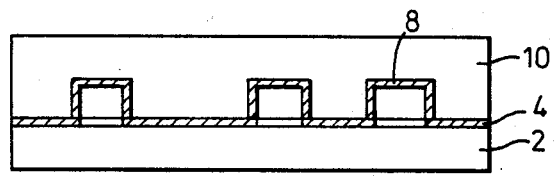
Figure 6:
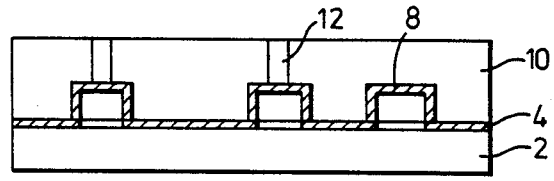

The firing step also has consequences for the underlying copper seed layer 4 and solid pattern 8 inasmuch as the constituent copper is oxidised to a depth which is that of the seed layer, i.e. 0.2 to 4 um (see FIG. 4).

Because the depth to which the copper is oxidised depends upon such factors as the firing temperature, the glassiness of the insulator, and the melting temperature of the glass, routine care must be taken to ensure that oxidation takes place to the desired depth for example by subjecting a test-piece to the desired production procedure. The result is that the WhOle of the seed layer 4 not covered by the conductive layer 8 is oxidised to form non-conductive copper oxide while the solid conductors of the solid pattern layer 8 which are for example 7 um thick with a 1 um thick seed layer are oxidised only to a depth of 2 um and this does not appreciably effect their conductive properties.

The net result is that the conductors 8 are buried in an air-fired dielectric 10. It will be appreciated that the oxidation of the outer skin of the solid conductor pattern 8 enables the insulator to become intimately bonded with the conductor. Futhermore the presence of a glass layer on the oxidised outer skin of the conductor inhibits further diffusion of oxygen from the insulator into the conductor.

Finally a through hole pattern is established in the dielectric layer 10 (see holes 12 in FIG. 6) to provide access to the conductors 8. The through holes 12 can be produced by laser drilling or by etching or abrading techniques.

The through holes 12 can be produced before the assembly is fired by screen printing methods, for example. Instead laser drilling and abrading or etching methods can be used.

It will be appreciated that the above described multilayer system provides a number of advantages.

The conversion of the copper seed layer 4 into copper oxide provides a glass forming material which has a high adhesion with the substrate 2, and the dielectric 10. The adhesion of the copper conductors 8 to the substrate may also be improved by the firing if a copper oxide bond is formed by diffusion of oxygen from the substrate, where this contains oxygen, e.g. alumina.

In effect, a function of the oxidised copper seed layer 4 is that during the firing step it should become non-conductive and glass-forming if combined with oxides such as PbO, BaO and $SiO_2$ which may be present in the dielectric insulator 10. Thus the glass insulator when molten in effect dissolves the copper oxide seed layer. The copper seed layer also complexes with any ceramic, glass or glass-ceramic substrate, and so a very strong bond is formed between the insulator and the substrate.

In the absence before firing of the copper seed layer between the substrate and insulator a conventional agent could be included in the glass insulator to promote adhesion directly between the substrate and insulator, although this is generally unnecessary.

The conversion of the seed layer 4 to an electrical insulator avoids the need to remove those parts of the seed layer 4 not underlying the copper conductor pattern 8.

In one modification of the described method following the step of electroplating with a copper pattern layer 8 and prior to the step of removing the residual resist, the copper pattern 8 is coated with a film 14 of a metal which will inhibit diffusion of oxygen into the copper conductor pattern 8. Metals particularly suitable for this purpose are nickel, palladium, gold, silver, chromium, rhodium or any alloy of any of these metals. The step has the effect of reducing the amount of pattern copper converted into copper oxide advantageously during the air firing step. The diffusion inhibiting film 14 is particularly useful to coat the copper areas where the through holes are formed since otherwise such areas would be always exposed to the air and therefore subject to oxidation.

In yet a further modification, the oxidation inhibiting layer 14 is coated with a thin film of copper to act as an adhesion layer between the oxidation inhibiting layer and the dielectric following the firing of the systems.

In yet another modification two resist steps and two copper plating steps are effected prior to the removal of the excess resist and the covering of the conductor pattern 8 with dielectric 10. The first resist is a thin layer formed by spinning a wet film resist to produce very high definition tracks (for example having a width of 10 um and a thickness of 4 um). The second resist is a thick layer deposited using a laminated dry film resist to produce features such as tracks 25 um thick and 35 um wide or sites over which the through holes will be formed in the insulator.

It will be appreciated that the multilayer system can be double-sided. In such systems the substrate is provided with a plurality of through holes and a conductive layer is formed on both sides of the substrate simultaneously. At the same time conductive material is deposited in the through holes to link the two conductive layers.

While in the embodiment described the seed layer is left intact on the substrate throughout the process it will of course be appreciated that it can be removed from areas other than directly under the conductive pattern prior to the dielectric deposition step. In this event the material of the seed layer 4 need not be oxidisable, for example it may be gold.

FIG. 7 includes a composite substrate 2, in which is a metal sheet 2A coated with an electrically insulating layer 2B.

I claim:

1. A method of producing a multilayer system characterised by:
   a. coating an electrically insulating substrate with a seed layer of an electrically conductive oxidisable material which on oxidation is non-conductive and glass-forming,
   b. depositing a pattern of solid conductor on the seed layer,
   c. oxidising the parts of the seed layer not in contact with the pattern to their full depth, and
   d. coating the whole with a firable dielectric which is fusable at 500° to 600° C., and then
   e. firing the system to 500° to 600° C. to fuse the dielectric.

2. A method as in claim 1, wherein step (d) immediately precedes step (c).

3. A method of producing a multilayer system comprising the steps of:
   a. forming a seed layer of an electrically conductive material on an electrically insulating surface of a substrate by electroless deposition, forming a resist layer corresponding to a negative of a desired pattern of copper onto the seed layer, electroplating said pattern of copper onto the exposed seed layer, removing the resist, and removing the seed layer selectively from areas not covered by the pattern; and subsequently
   b. oxidising part of the pattern; and
   c. screen printing an air firing dielectric comprising particles of dielectric held together with a binder onto the pattern and any seed layer not covered by the pattern; and
   d. subsequently firing the dielectric to a temperature sufficient to cause fusion of the dielectric, whereby a bond is formed between the fused dielectric and the oxidised part of the pattern, characterised in that the pattern is solid and bonded to the substrate in step (a), the dielectric is fusable at 500° to 600° C., the dielectric is fired, in air, to 500° to 600° C., and only an outer layer of the pattern is oxidised, such that the conductive properties of the pattern are not appreciably effected.

4. A method as in claim 3, wherein step (c) immediately precedes step (b).

5. A method of producing a multilayer system comprising the steps of:
   a. forming a pattern of electrically conductive oxidisable material to an electrically insulating surface of a substrate;
   b. oxidising part of the pattern; and
   c. burying the pattern in a firable dielectric; and then
   d. firing the dielectric to intimately bond the fired dielectric to the oxidised part of the pattern, characterised in that the pattern is solid, the dielectric is fusable at 500° to 600° C., the dielectric is fired to 500° to 600° C., and only an outer layer of the pattern is oxidised such that the conductive properties of the pattern are not appreciably effected.

6. A method as in claim 5, wherein step (c) immediately precedes step (b).

7. A method as in claim 5, wherein the pattern is formed by sputtering or evaporation through a mask.

8. A method as in claim 5, wherein the pattern is formed by plating, sputtering or evaporation and the conductive material is subsequently selectively removed.

9. A method as in claim 5, wherein the pattern is formed by resist-guided electroless plating.

10. A method as in claim 5, wherein the pattern is formed by directly chemically bonding a sheet of conductive material to a substrate at high temperature with subsequent selective removal of the material.

* * * * *